United States Patent [19]

Nilarp

[11] Patent Number: 4,638,553

[45] Date of Patent: Jan. 27, 1987

[54] METHOD OF MANUFACTURE OF SEMICONDUCTOR DEVICE

[75] Inventor: Anders Nilarp, Rancho Palos Verdes, Calif.

[73] Assignee: International Rectifier Corporation, Los Angeles, Calif.

[21] Appl. No.: 784,177

[22] Filed: Oct. 4, 1985

Related U.S. Application Data

[62] Division of Ser. No. 447,760, Dec. 8, 1982.

[51] Int. Cl.⁴ .................. H01L 21/302; H01L 29/743
[52] U.S. Cl. .......................................... 29/580; 29/583; 29/589; 29/590; 29/591; 357/35; 357/57; 357/71; 357/81
[58] Field of Search ............... 29/580, 589, 590, 583; 148/DIG. 28; 357/35, 81, 55; 156/657, 645

[56] References Cited

U.S. PATENT DOCUMENTS

| | | | |
|---|---|---|---|
| 3,893,153 | 7/1975 | Page et al. | 357/38 |
| 4,080,620 | 3/1978 | Chu | 357/38 |
| 4,141,136 | 2/1979 | Henry et al. | 29/590 |
| 4,176,443 | 12/1979 | Iannuzzi et al. | 29/589 |
| 4,224,101 | 9/1980 | Tijburg et al. | 156/643 |

FOREIGN PATENT DOCUMENTS 0018463  2/1981  Japan ................................ 357/675

Primary Examiner—Brian E. Hearn
Assistant Examiner—Tom Thomas
Attorney, Agent, or Firm—Ostrolenk, Faber, Gerb & Soffen

[57] ABSTRACT

The junctions of a plurality of semiconductor devices are formed in a common wafer. The upper surface of the common wafer is metallized for each of the individual devices by a nickel, chromium, nickel, silver metallizing system. Individual wafer elements are thereafter separated from the main wafer and their bottom surfaces are vacuum-alloyed to a molybdenum expansion plate. Thereafter, the outer periphery of the devices is tapered by grinding and the periphery is etched by hot potassium hydroxide without need to protect the upper metallizing from the etch. The caustic etch is washed with citric acid. Thereafter, the periphery is passivated by a passivation coating.

22 Claims, 13 Drawing Figures

METHOD OF MANUFACTURE OF SEMICONDUCTOR DEVICE

RELATED APPLICATIONS

This is a divisional application of U.S. patent application Ser. No. 447,760, filed Dec. 8, 1982.

BACKGROUND OF THE INVENTION

This invention relates to semiconductor devices, and more specifically relates to a novel method for manufacture of a plurality of semiconductor devices from a common wafer.

The initial steps in the manufacture of power semiconductor devices such as controlled rectifiers or the like normally take place in a wafer fabrication facility in which a very large diameter wafer has junctions formed therein for a plurality of identical devices. After the formation of the junctions in the large wafer, the individual devices are separated from the wafer and are then further processed separately, usually in an assembly facility. In the further processing, an expansion plate contact is first alloyed to the bottom of the individual wafer elements. Thereafter contact metals are applied to the upper surface of the individual wafer elements. This contact metallizing process normally requires masking and oxide-etching for each individual wafer element.

The above sequence of first alloying the expansion contact and later applying contact metals has been necessary because the contact metals used in power devices are commonly aluminum. The aluminum contact metal would diffuse into the wafer surface at the alloying temperatures used for applying the expansion contact to the bottom of the wafer and would interfere with the diffused junction pattern.

After metallizing, the outer periphery of the individual wafer element is tapered to increase the breakdown voltage of the device. This process employs either an acid etch process or a grinding process followed by an acid etch to remove the damage caused by the grinding. However, the aluminum contact can be attacked by the acid etch used in the beveling operation. Therefore, it was necessary to protect the metallizing by coating it, for example, by gold plating and by wax, prior to the acid etch operation.

All of the above steps were carried out in an assembly area on individual wafer elements which must be separately handled. Thus, the added steps and separate handling substantially increase the expense of the device and reduce process yield.

BRIEF DESCRIPTION OF THE INVENTION

In accordance with the present invention, a metallizing system is applied to the wafer in the wafer fabrication facility before the wafer is cut into its individual devices. The metallizing system employs nickel, chromium, nickel and silver. This metallizing system makes ohmic contact to underlying bare silicon surfaces, and is capable of surviving subsequent alloying temperatures employed in alloying an expansion contact to an individual wafer element. After the metallizing is applied to the wafer, the wafer is cut into individual wafer elements. These are then alloyed to respective bottom expansion contacts in a vacuum alloying process which might employ temperatures as high as 650° C. for 30 minutes.

Since the metallizing system has an outer silver layer, a hot caustic etch can be applied to the outer periphery of the wafer elements after the beveling operation without protecting the metallizing from the caustic etch. Preferably, potassium hydroxide is used for the etching operation and citric acid is used for a final rinse. Sodium hydroxide can also be used as the etchant. Since no protection is necessary for the metallizing system during the etch of the periphery of the device, several process steps are saved as compared to the prior beveling operation employing an acid and a nickel plated aluminum contact.

The process is provided for manufacture of high power semiconductor devices which can, for example, be silicon controlled rectifiers having reverse voltages up to 5,000 volts and forward currents greater than about 50 amperes. However, the invention can be applied to any high power device which employs an expansion plate contact and/or a beveled outer periphery.

BRIEF DESCRIPTION OF THE DRAWINGS

FIG. 9 shows the wafer of FIG. 2 after a photolithographic masking and oxide etching of the unscribed wafer and after the novel silicon etch process to prepare the surface for metallization.

DETAILED DESCRIPTION OF THE INVENTION

Figure 1:
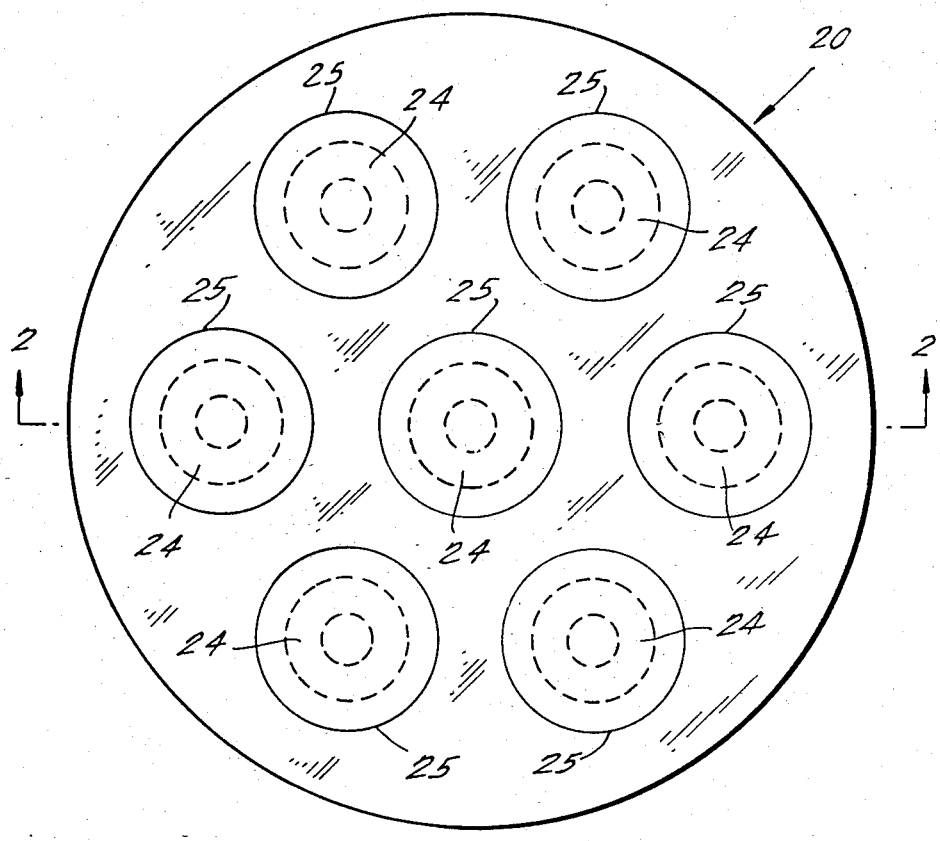
FIG. 1 is a plan view of a semiconductor wafer which contains a large number of individual devices which are simultaneously processed in a wafer fabrication facility.
Figure 2:
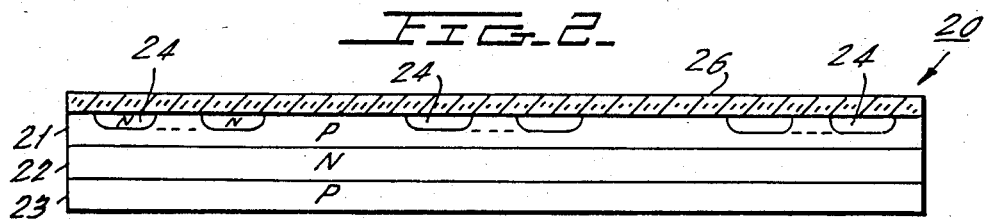
FIG. 2 is a cross-sectional view of FIG. 1 taken across the section line 2—2 in FIG. 1.

Referring first to FIGS. 1 and 2, there is shown a conventional silicon wafer 20, which can have any desired configuration, and which is shown in greatly exaggerated thickness for purposes of clarity. Typically, wafer 20 may have a diameter of 4 inches and a thickness from 10 to 40 mils, typically, 15 mils. The wafer is treated in a suitable wafer fabrication facility which provides extremely clean conditions for the processing of the wafer in any desired manner. By way of example, the wafer of FIGS. 1 and 2 was processed to form junction patterns for a plurality of controlled rectifiers or thyristors. Thus, the overall wafer 20 has a P-type layer 21 followed by an N-type layer 22, followed by a P-type layer 23. The plurality of controlled rectifiers to be formed have a center gate configuration and are all provided with an N-type annular cathode region 24. The underlying P-type layer 23, which is the gate region for each device, is exposed at the center of each annular region 24.

The final step in the wafer fabrication in the prior art process for the overall wafer 20 is the formation of the cathode regions 24. During this step, which commonly is a diffusion operation, an oxide layer 26 grows on the surface of the wafer 20. This oxide layer 26 may have a thickness, typically, of 0.05 mils and is used in the subsequent processing of the device.

It would be desirable to continue with processing steps for completing the devices to be formed in the wafer of FIGS. 1 and 2 in the wafer fabrication facility which is best adapted for carrying out steps such as masking, oxide etching and the like. Morever, it would have been desirable to metallize the various P and N regions at the surface of the wafer of FIG. 2 which are to receive contacts or electrodes while the wafer is in the wafer fabrication facility. However, this could not be done with existing contact systems such as aluminum which would diffuse into the silicon during subsequent alloying steps necessary to fasten expansion plate type contacts to the bottom surface of the wafer elements. Consequently, in the prior art process, wafers 20 at the stage of manufacture shown in FIGS. 1 and 2 were removed from the wafer fabrication facility.

Figure 3:
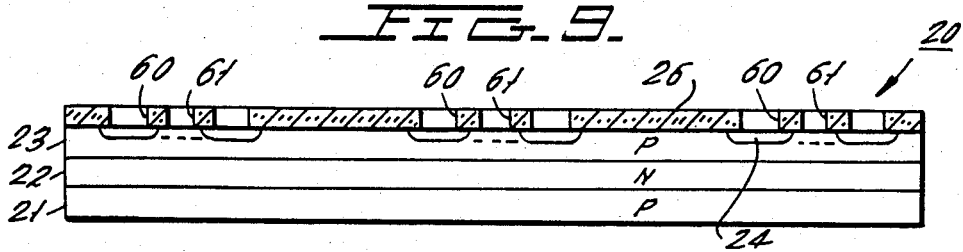
FIG. 3 shows one of the wafer elements of FIGS. 1 and 2 after it has been laser scribed from the wafer in a prior art process.
Figure 3:
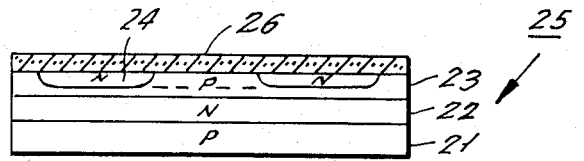

Wafer elements, such as element 25 of FIG. 3, were suitably separated from the wafer 20 as by a laser scribing operation. Seven individual circular wafer elements 25, each of which has a diameter, for example, of 0.75" are scribed from wafer 20 in the example of FIGS. 1, 2 and 3. Wafer elements 25, after their processing is complete, are to be used in controlled rectifiers which might have reverse voltage ratings of up to 5,000 volts and forward current ratings of greater than 50 amperes. Different number of wafer elements can be cut from wafer 20, depending on the rating of the device to be formed. It will also be noted that the description of the invention to follow hereinafter employs the example of a controlled rectifier. However, the invention can apply to any device formed in the silicon wafer regardless of the number of junctions or junction pattern and would also apply to the manufacture of a single device in a single wafer.

All steps following the laser scribing steps of FIG. 3 are usually carried out in an assembly area which is not as clean or well controlled as a wafer fabrication facility. However, the conditions in the assembly area are normally of sufficient quality to permit carrying out of the subsequent steps to be described in FIGS. 4-8 for the prior art system.

Figure 4:
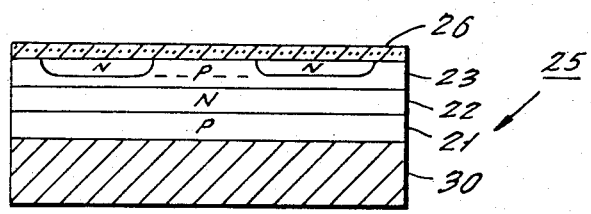
FIG. 4 shows the wafer element of FIG. 3 after it has been alloyed to a molybdenum contact in a prior art technique.

In the first step carried out, and as shown in FIG. 4 for the single wafer element 25, a plurality of individual elements 25 are alloyed to expansion plate contacts such as contact 30 which can be of molybdenum or tungsten or the like. Typically, contact 30 will be a molybdenum contact having the same diameter as the wafer 25 and having a thickness from 30 to 120 mils, typically 60 mils. Note that the relative dimensions of the wafer and the contact are distorted in FIGS. 4-8 for purposes of clarity. The alloying of the contact 30 to the wafer 25 takes place at a relatively high temperature. Therefore, the prior art alloying operation was carried out prior to the application of aluminum contacts to regions 23 and 24 of wafer 25 since an aluminum contact would diffuse into these regions at alloying temperatures and would form a P-type region within the N-type region 24.

Figure 5:
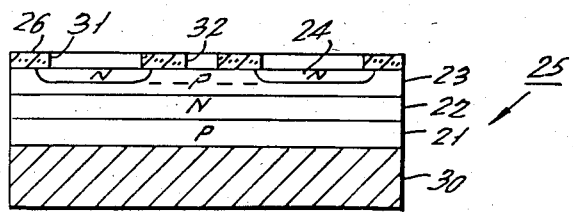
FIG. 5 shows the wafer of FIG. 4 after a masking and oxide etch step preparatory to the formation of a prior art contact system.

Thereafter, and as shown in FIG. 5, the upper surface of the individual wafer elements 25 is photolithographically masked and the oxide layer 26 is etched to open an annular window 31 over the N-type annular region 24 and to open a central window 32 in the center of each wafer element 25. The window 31 will subsequently receive a cathode contact for the controlled rectifier, while the central window 32 will receive a gate contact.

Figure 6:
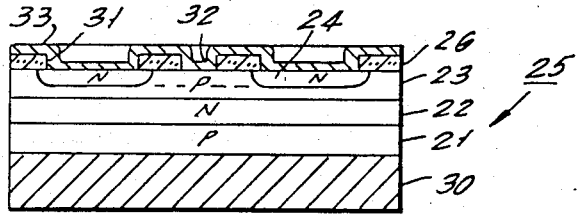
FIG. 6 shows the wafer of FIG. 5 after the evaporation of an aluminum contact onto the upper surface of the device in a prior art process.

As shown in FIG. 6, an aluminum contact layer 33 is next evaporated or otherwise applied onto the upper surface of each wafer element 25 with the photoresist on the oxide remaining in place. Layer 33 enters windows 31 and 32 to make contact to the cathode and the gate regions of wafer elements 25. Aluminum layer 33 typically has a thickness of 5 mils.

The wafer element 25 of FIG. 6 is then placed in an oven and exposed to an elevated temperature in a neutral or reducing atmosphere in order to sinter the aluminum layer into the silicon surface and decomposes the photoresist. The aluminum will not adhere to the underlying oxide layer 33 but adheres to the underlying decomposed photoresist. Therefore, after the sintering operation, the aluminum which overlies the oxide 33 is easily lifted off and aluminum remains only within the windows 31 and 32, adhered to the silicon surface of wafer element 25.

Figure 7:
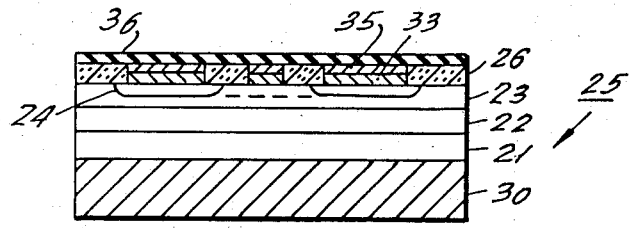
FIG. 7 shows the wafer of FIG. 6 after the aluminum contact has been nickel plated and gold plated and lifted off the oxide, with the edges of the device ground and the upper surface of the device sprayed with a wax.

Thereafter, and as shown in FIG. 7, the upper surface of the wafer is nickel plated with the nickel plating adhering to the upper surface of the aluminum contact 33. The nickel plate has a thickness of about 0.03 mils, and is solderable to subsequently applied leads. After the nickel plating step of FIG. 7, gold is plated over the nickel to a thickness of 3,000 Angstroms. The nickel and gold layers are shown collectively by numeral 35. The gold plating is used to protect the underlying nickel and aluminum from a subsequent acid etch. The upper surface of the wafer element 25 is thereafter coated with a suitable wax coating 36 such as an apezion wax which protects the coated surfaces from attack by an acid etch to be subsequently used.

Figure 8:
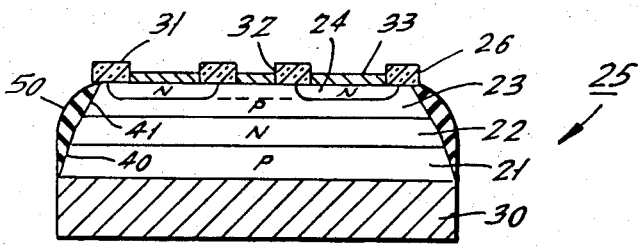
FIG. 8 shows the device of FIG. 7 after the prior art steps of beveling, etching, wax stripping and application of a varnish to the outer periphery of the device.

Thereafter, and as shown in FIG. 8, the outer periphery of the wafer 25 is beveled as by grinding. The bevel shown in FIG. 8 has a first conical surface 40 which creates a first angle of interception of the wafer boundary by the reverse junction between regions 21 and 22 of about 35°. A second conical surface 41 is also ground which has a second interception angle between the outer periphery of the wafer element and the forward junction between regions 22 and 23 from 2° to 10°, typically 4°. Note that these angles are not shown to scale since the device dimensions have been greatly exaggerated for purposes of clarity.

The device is next subject to an acid etch which etches the outer periphery of the device. This acid etch cannot attack the remaining nickel-plated aluminum contact since it is protected by the overlying gold layer and wax layer. As shown in FIG. 8, the wax coating 36 is then stripped away and the device is subjected to a light polish etch. A varnish layer 50 is then applied to the outer periphery of wafer element 25 to passivate the etched junction edges. An elastomer such as a material known by the trademark "SILASTIC" can also be applied to the wafer element.

The overall device of FIG. 8 may then be suitably mounted in a device housing. Electrical contacts can be made to the cathode and gate contact layers which are exposed through windows 31 and 32.

The novel process of the invention which replaces the process disclosed in FIGS. 3 to 8 is shown in connection with FIGS. 9 to 13. As shown in FIG. 9 which is on the sheet of drawings containing FIGS. 1 and 2, the wafer of FIG. 2, prior to the laser-scribing operation, is subjected to a single photolithographic masking and etching step which opens windows in oxide layer 26 to expose the cathode and gate regions of each of the individual wafer elements 25 before they are scribed from the wafer 20. Thus, as shown in FIG. 9, windows 60 and 61 which are annular and central windows, respectively, lie over respective annular cathode regions 24 and central gate regions of each of wafer elements 25 defined in the wafer 20. By way of example, the oxide etch process to open windows 60 and 61 can employ a conventional buffered oxide etch. This process is carried out in the wafer fabrication facility which is designed for carrying out such a process. Note that the equivalent mask and etch process was carried out in the prior art in the step of FIG. 5 for each of the individually-scribed elements 25 and in a wafer assembly facility.

Following the opening of the windows 60 and 61, the exposed surface of the silicon wafer 20 is treated in a novel manner which enables desirable contact metals to adhere tenaciously to the treated silicon but not to the surrounding oxide. Thus, it would be desirable to employ a nickel, chromium, nickel, silver contact metallization system for high power silicon devices (those having a rated forward current greater than about 50 amperes) if the contact metals would reliably adhere to the underlying silicon surface after subsequent high temperature process operations, such as those employed for alloying expansion plates to individual devices. In the past, however, the adherence of the metals in such a system was not reliable since the upper silver layer frequently delaminated from the nickel underlying the silver in an uncontrolled and apparently arbitrary manner. Moreover, the bottom nickel layer sometimes bubbled away from the underlying silicon surface.

In accordance with the present invention, and to ensure that the metallizing system wil adhere reliably to the underlying silicon, the following pretreatment of the silicon surface exposed through the windows 60 and 61 is used. After windows 60 and 61 have been opened by removal of the oxide in FIG. 9, it was presumed that the exposed surface of the silicon is oxide-free. In fact, there was an oxygen saturated layer of silicon below the silicon-silicon dioxide interface. Thus, there is sufficient oxygen released from the uppermost surface layers of the silicon substrate to cause nonadherence and delamination of the metallizing layers during a subsequent sintering step. In accordance with the invention, a novel etch is employed to remove a sufficient thickness from the exposed silicon surface to ensure that the exposed surface is completely oxygen-free. It has been found sufficient to remove from about 1 to 3 microns of the polished surface exposed through windows 60 and 61. Preferably about 2 microns should be removed.

It has been found that delamination problems exist if one micron or less of the surface is removed. If more than about 3 microns are removed, gate voltage and gate current characteristics are unacceptably affected.

The silicon etch preferably employs an etching solution consisting of 2 parts of hydrofluoric acid, 9 parts of nitric acid and 4 parts of acetic acid which are applied through the windows 60 and 61 to the exposed silicon surface of wafer 20 for about 15 seconds. Thereafter, the wafer 20 is placed in a tub rinse for about 5 minutes to flush away the acid.

Following the tub rinse, the wafer 20 is exposed to a light etch consisting of 50 parts of deionized water to 1 part of hydrofluoric acid for about 30 seconds. This step strips any chemical oxide which remains after the initial etch which employed nitric acid as one component. The wafer 20 is then raised in a tub rinse for about 5 minutes and is spun dry in the usual manner.

Figure 10:
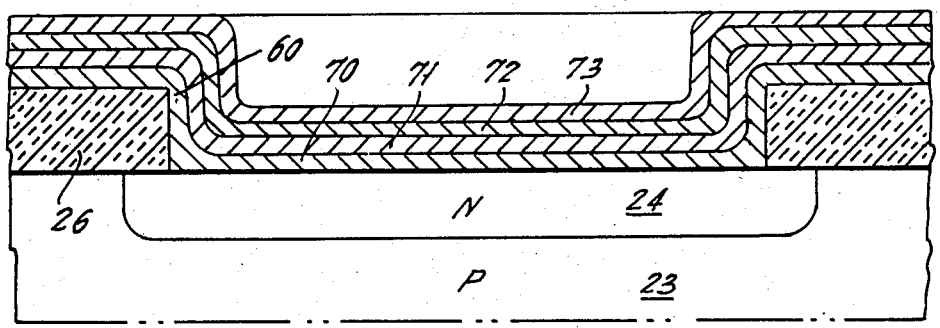
FIG. 10 is a greatly enlarged view of a portion of the full wafer of FIG. 9 after metallization by four sequential metal layers which strongly adheres to the treated silicon surface.

The metal layers 70 to 73 of FIG. 10 are thereafter applied to the treated surface, by evaporation techniques in vacuum. For example, after pumping a vacuum for about 15 minutes, the substrate is heated to about 125° C. When the pressure has dropped to about $5 \times 10^{-6}$ torr, a first nickel layer 70 is evaporated onto the surface to a thickness is from 125 to 1,000 Angstroms, preferably 200 Angstroms. Nickel layer 70 should have a thickness sufficient to allow its conversion to nickel silicide during the deposition operation. The substrate shold be at a temperature of 100° C. or greater during the deposition of nickel to encourage its conversion to a silicide.

The purpose of the silicon etch step is to remove any source of oxygen in the treated surface. It is believed there is normally an oxygen saturated layer of silicon immediately below the $SiO_2$/Si interface. If allowed to remain undisturbed, during silicide formation, it is believed that oxygen atoms in the involved region become highly mobile, and diffuse upward to become trapped at the nickel-silver interface to be formed. The final result is an oxidized film which destroys the nickel-silver interface and delamination results.

In addition, the nickel layer 60 will bubble off of the substrate if any oxygen is present in the substrate underlying the nickel after the metallizing system is completed. The etching of the silicon, however, removes all traces of oxygen from the exposed monocrystalline silicon wafer surface and solves delamination of the nickel-silver interface problem and the problem of release of nickel from the silicon.

Chromium, nickel and silver layers 71, 72 and 73, respectively, are then separately evaporated into layer 70, as shown in FIG. 10. The wafer is thereafter allowed to cool to room temperature.

Chromium layer 71 has a thickness sufficient to act as a diffusion barrier, and can, for example, be from 500 to 3,000 Angstroms, preferably 1,500 Angstroms. Nickel layer 72 has a thickness sufficient to prevent leaching of silver from layer 73 into layer 71 and can, for example, be 1,000 to 6,000 Angstroms, preferably 4,000 Angstroms. Silver layer 73 is thick enough to receive solder connections and should be greater than about 1 micron, and may be 6 microns.

Figure 11:
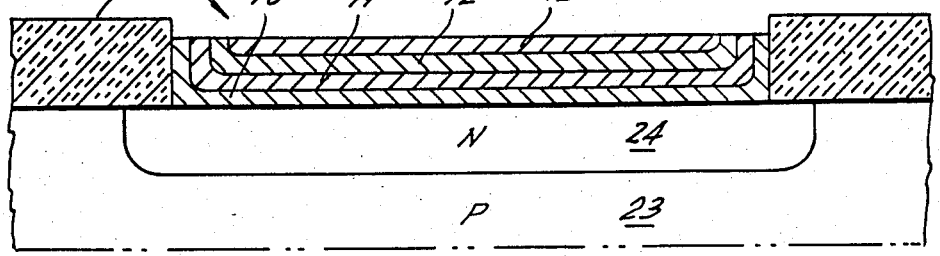
FIG. 11 shows the structure of FIG. 10 after a sinter and lift-off process in which the metallizing lifts off of the oxide coating on the silicon wafer.

Following the metal deposition operation, a lift-off process takes place in which the nickel layer 70, and the metal layers 71, 72 and 73 disposed atop the underlying oxide layer 26 are lifted off the oxide, as shown in FIG. 11.

To carry out the lift-off process, the wafer 20 is immersed in deionized water containing a detergent and is exposed to ultrasonic energy for about 15 minutes to loosen the metal on the insulation layer 26. The wafers are then exposed to a spray of deionized water which flushes away all of the loose metal which overlies the silicon dioxide layer 26. The wafer is then tub rinsed and spun dry and inspected for residual metal. Any residual metal can be blown off with a jet of nitrogen gas.

The wafer 20 now has the general appearance shown in FIG. 11, wherein layers 70, 71, 72 and 73 are firmly adhered to the areas exposed in windows 60 and 61. The metallizing will survive temperatures which are subsequently applied to the device during alloying or other procesing steps. Furthermore, the metallizing will be resistant to certain chemical etches which are subsequently applied to the wafer elements 25. Further, the metallizing makes low resistance connection to either P-type or N-type silicon and the contacts are solderable, have low lateral impedance and are resistant to thermal fatigue.

Figure 12:
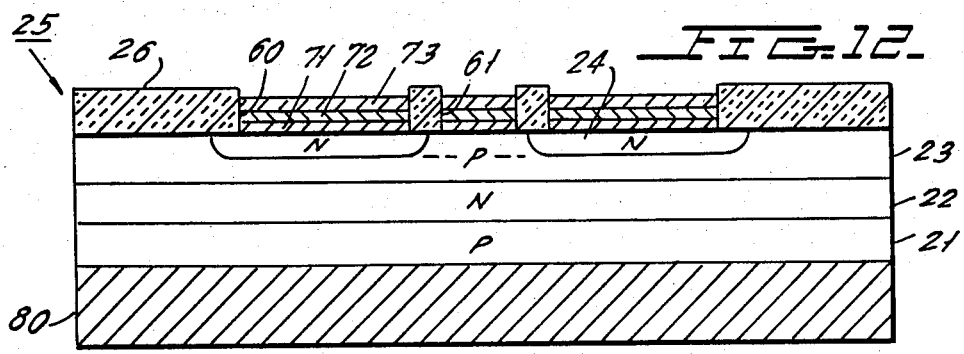
FIG. 12 shows one wafer element separated from the wafer of FIGS. 2, 9, 10 and 11 by a laser-scribing operation and shows a molybdenum contact which is subsequently alloyed to the wafer element.
Figure 13:
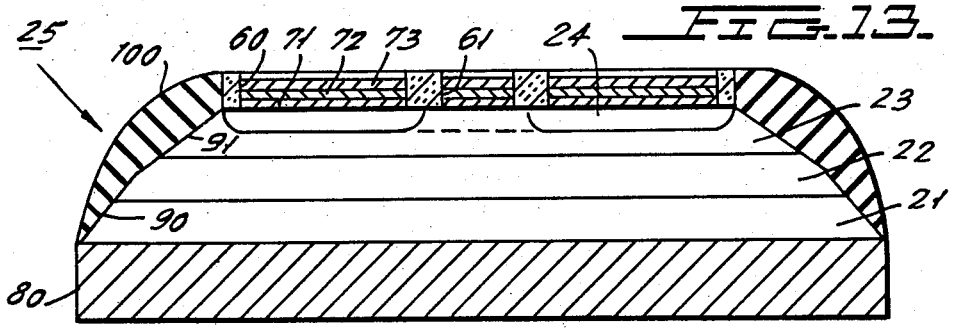
FIG. 13 shows the device of FIG. 12 after beveling and treatment with a hot caustic etch and the application of a passivation coating to the outer periphery of the device.

The metallization system also makes possible a novel improved process for completing the structure of the wafer 25, as shown in FIGS. 12 and 13. More specifically, the new metallization system permits vacuum alloying of individual wafer elements to expansion plates after metallizing. This is because there will be no adverse contact metal diffusion or damage during alloying, and because the edge of the junction can be etched by a caustic etch which will not attack the overlying silver of the metallizing system.

Thus, for the next step of the overall process, individual metallized wafer elements 25 of FIG. 1 are cut, as by laser scribing, from the wafer 20 of FIGS. 9, 10 and 11. Each individual wafer element 25 is then alloyed to an expansion plate such as plate 80 shown in FIG. 12. The expansion plate 80 can, for example, be a molybdenum disc having a thickness of 60 mils. The vacuum-alloying process takes place in nitrogen at a pressure of about $4 \times 10^{-5}$ torr, at a temperature of about 650° C. for about 30 minutes. A large number of wafer elements 25 are simultaneously processed. Since the vacuum alloying process of FIG. 12 takes place after the contact metals have been applied, the plural steps of the prior art processes of FIGS. 5, 6 and 7 are eliminated.

Following the alloying step, the outer peripheral surface of individual wafer elements 25 are ground on a diamond wheel, for example, to form a first ground conical surface 90 shown in FIG. 13. Surface 90 can form an angle of about 35° relative to the junction between regions 21 and 22. Thereafter, a second conical surface 91 is ground, which has an angle to the junction between regions 22 and 23 of about 4°. These angles are not shown to scale in FIG. 13. The wafer elements 25 are then rinsed with deionized water and cleaned an ultrasonic cleaning bath.

Thereafter, the outer ground periphery of the wafer 25 is subjected to a novel caustic etch which removes the damage caused at the outer periphery by the grinding operation. The novel caustic etch step can be carried out without the need for a protective gold plating or wax or the like on the metallizing layer since the silver layer 73 is resistant to the caustic etch. The caustic etch fluid is preferably potassium hydroxide.

More specifically, in accordance with the invention, about 80 grams of potassium hydroxide in about 1 liter of deionized water is heated to about 95° C. to 100° C. A solution of 80 grams of citric acid in about 1 liter of deionized water at room temperature is also prepared. The wafer elements 25 are first placed in hot running deionized water for about 1 minute. They are thereafter placed in the potassium hydroxide solution for approximately 3 minutes with the support fixture containing the wafer elements 25 being constantly agitated. The wafer elements are then removed from the potassium hydroxide solution and placed in hot running deionized water for about 3 minutes.

Thereafter, the wafer elements are placed in the citric acid solution for approximately 30 seconds while being constantly agitated. The wafer elements are then immersed in hot running deionized water for about 2 minutes and are then appropriately dried as by irradiation under an infrared lamp.

The wafer elements 25 are then loaded into a coating tray and their surfaces are coated with a suitable pacification coating 100 as shown in FIG. 13. The coating 100 may be of any desired type. Preferably the coating is a material known by the trademark "SILASTIC", such as Q 1-4935 manufactured by Dow-Corning Company. After coating, the wafer elements 25 are placed in a vacuum chamber for about 10 minutes and are thereafter heated to about 325° C. for about 20 minutes. The completed wafer elements can then be mounted in a suitable housing or otherwise further processed.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. The method of making a plurality of semiconductor devices which are simultaneously processed and metallized with plural metallizing layers while said devices constitute parts of a common thin, flat silicon wafer having substantially parallel first and second surfaces; said metallizing being intimately secured in ohmic contact with a plurality of spaced portions of said first surface and being capable of withstanding temperatures which are encountered in subsequent processing steps; said metallizing including a non-junction-forming metal in contact with said first surface of said wafer and an outer solderable metal layer which is non-reactive to a caustic etch; said method comprising the steps of: separating a plurality of wafer elements from said wafer with each of said wafer elements having at least one respective metallizing area on at least a portion of the first surface thereof; securing a respective expansion plate contact to the second surface of each of said wafer elements; and etching the outer periphery of each of said wafer elements with a caustic etch.

2. The method of claim 1 which further includes the step of flushing away said caustic etch with a weak acid.

3. The method of claim 1 wherein each of said wafer elements is identical.

4. The method of claim 1 wherein said metallizing includes a layer of nickel-silicide in contact with said first surface and wherein said outer solderable metal layer is silver.

5. The method of claim 4 which further includes a layer of chromium atop said nickel-silicide layer, and a layer of nickel disposed between said chromium layer and said silver layer.

6. The method of claim 1 wherein said caustic etch is potassium hydroxide.

7. The method of claim 6 which includes the further step of flushing said potassium hydroxide with citric acid after said potassium hydroxide is in contact with said outer periphery of each of said wafer elements for a given time.

8. The method of claim 1 wherein said wafer elements are separated from said wafer by laser scribing.

9. The method of claim 1 wherein each of said expansion plates is secured to respective ones of said wafer elements by vacuum alloying at temperatures of about 650° C.

10. The method of claim 2, 3, 4, 5, 6, 7 or 8 wherein each of said expansion plates is secured to respective ones of said wafer elements by vacuum alloying at temperatures of about 650° C.

11. The method of claim 2, 4, 5, 6, 7 or 9, wherein each of said wafer elements is identical.

12. The method of claim 6, 7, 8 or 9 which further includes a layer of chromium atop said nickel silicide layer, and a layer of nickel disposed between said chromium layer and said silver layer.

13. The method of claim 2, 3, 4, 5, 6, 7 or 9 wherein said wafer elements are separated from said wafer by laser scribing.

14. The method of making a semiconductor device employing a silicon wafer which has a given junction pattern therein and a given conductive pattern on one surface thereof formed of a plurality of superimposed metallizing layers which includes a first nickel layer in contact with the underlying silicon of said one surface, a layer of chromium overlying said first nickel layer, a second nickel layer overlying said chromium layer and an upper layer of silver; said method comprising the steps of alloying a metal expansion plate to the second surface of said wafer which is opposite to said one surface; and etching, with a caustic etch, the full outer periphery of said wafer and all portions of said first and second surfaces of said wafer which are not covered by said metallizing or by said expansion plate, while exposing said upper layer of silver to said caustic etch.

15. The method of claim 14 which includes the further step of flushing away said caustic etch with a weak acid.

16. The method of claim 14 wherein said first nickel layer is sintered into said underlying silicon.

17. The method of claim 16 wherein said plurality of metallizing layers are deposited by evaporation in a vacuum.

18. The method of claim 14 wherein said caustic etch is potassium hydroxide.

19. The method of claim 18 which includes the further step of flushing away said potassium hydroxide with citric acid.

20. The method of claim 14 wherein each said expansion plate is secured to said wafer by vacuum alloying at temperatures of about 650° C.

21. The method of claim 17 wherein said caustic etch is potassium hydroxide.

22. The method of claim 21 wherein each said expansion plate is secured to said wafer by vacuum alloying at temperatures of about 650° C.

* * * * *